(12) United States Patent
Wan et al.

(10) Patent No.: US 12,464,916 B2
(45) Date of Patent: Nov. 4, 2025

(54) DISPLAY PANEL WITH METAL OXIDE LAYER

(71) Applicant: Shenzhen China Star Optoelectronics Semiconductor Display Technology Co., Ltd., Guangdong (CN)

(72) Inventors: Zhijun Wan, Guangdong (CN); Jinchuan Li, Guangdong (CN); Weiran Cao, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 476 days.

(21) Appl. No.: 17/976,821

(22) Filed: Oct. 30, 2022

(65) Prior Publication Data
US 2024/0122018 A1    Apr. 11, 2024

(30) Foreign Application Priority Data
Oct. 8, 2022   (CN) .......................... 202211230099.5

(51) Int. Cl.
| H10K 59/131 | (2023.01) |
| H10K 50/816 | (2023.01) |
| H10K 59/12  | (2023.01) |
| H10K 71/00  | (2023.01) |

(52) U.S. Cl.
CPC ....... *H10K 59/1315* (2023.02); *H10K 50/816* (2023.02); *H10K 71/00* (2023.02); *H10K 59/1201* (2023.02)

(58) Field of Classification Search
CPC .. H10K 59/1315; H10K 50/816; H10K 71/00; H10K 59/1201; H10K 50/16; H10K 59/80522; H10K 50/858; H10K 59/12; H10K 59/38; H10K 59/1213; H10K 59/123; H10K 59/122; G02B 30/29; G02B 3/0006; G02F 1/133526; H05K 2201/10106
See application file for complete search history.

(56) References Cited

U.S. PATENT DOCUMENTS

| 9,559,327 | B2 * | 1/2017 | Yoneda | H10K 50/171 |
| 9,564,609 | B2 * | 2/2017 | Sasaki | H10K 50/818 |
| 9,577,206 | B2 * | 2/2017 | Yamae | H10K 59/877 |
| 9,587,172 | B2 * | 3/2017 | Lee | H10K 50/165 |
| 9,647,228 | B2 * | 5/2017 | Seo | H10K 50/19 |
| 9,653,517 | B2 * | 5/2017 | Uesaka | H10K 50/11 |
| 10,367,162 | B1 * | 7/2019 | Boardman | H10K 50/115 |
| 10,522,775 | B2 * | 12/2019 | Tsukamoto | H10K 50/171 |

(Continued)

*Primary Examiner* — Caleb E Henry

(57) ABSTRACT

An embodiment of the present invention discloses a display panel and a manufacturing method thereof. The display panel includes a driver wiring layer, an electron transport layer, an electron injection layer, and a cathode layer. The driver wiring layer includes a cathode voltage line, and the electron transport layer is connected to the cathode voltage line. The cathode layer is connected to the electron injection layer. Patterns of the electron transport layer and the electron injection layer are the same as a pattern of the cathode layer. The display panel further includes a resistance reduction layer located between the cathode voltage line and the electron transport layer. The present invention simultaneously patterns the cathode layer, the electron injection layer, and the electron transport layer by a mask plate and forms the same patterns.

8 Claims, 6 Drawing Sheets

(56) References Cited

U.S. PATENT DOCUMENTS

| | | | | |
|---|---|---|---|---|
| 10,600,980 B1* | 3/2020 | Boardman | H10K 59/877 |
| 10,749,130 B2* | 8/2020 | Kim | H10K 50/15 |
| 10,826,010 B1* | 11/2020 | Montgomery | H10K 50/115 |
| 2002/0189542 A1* | 12/2002 | Van Slyke | C23C 14/12 | 118/712 |
| 2003/0211651 A1* | 11/2003 | Krasnov | C09K 11/883 | 438/102 |
| 2005/0098207 A1* | 5/2005 | Matsumoto | H10K 50/155 | 313/506 |
| 2007/0286944 A1* | 12/2007 | Yokoyama | H10K 59/876 | 427/66 |
| 2008/0264475 A1* | 10/2008 | Ito | H01M 14/005 | 136/252 |
| 2009/0243473 A1* | 10/2009 | Iwakuma | H10K 50/11 | 313/504 |
| 2011/0073884 A1* | 3/2011 | Lee | H10K 50/166 | 257/89 |
| 2012/0086331 A1* | 4/2012 | Kobayashi | H10K 50/13 | 313/504 |
| 2012/0292647 A1* | 11/2012 | Lee | H10K 59/30 | 257/89 |
| 2014/0353610 A1* | 12/2014 | Lee | H10K 59/353 | 438/34 |
| 2015/0144897 A1* | 5/2015 | Kang | H10K 50/19 | 257/40 |
| 2016/0150619 A1* | 5/2016 | Krummacher | H10K 50/88 | 315/224 |
| 2016/0233449 A1* | 8/2016 | Murayama | C09K 11/565 |
| 2016/0293676 A1* | 10/2016 | Komatsu | H10K 71/135 |
| 2016/0359117 A1* | 12/2016 | Hamade | H10K 85/657 |
| 2017/0012231 A1* | 1/2017 | Mishima | H10K 50/11 |
| 2017/0141337 A1* | 5/2017 | Hamade | H10K 85/626 |
| 2017/0269745 A1* | 9/2017 | Ding | G06F 3/04166 |
| 2017/0269762 A1* | 9/2017 | Xu | G06F 3/0412 |
| 2018/0062101 A1* | 3/2018 | Li | H10K 50/115 |
| 2018/0254421 A1* | 9/2018 | Kinge | H10K 50/15 |
| 2018/0342205 A1* | 11/2018 | Wang | H10K 59/8052 |
| 2019/0013364 A1* | 1/2019 | Yokota | H10K 50/16 |
| 2019/0081263 A1* | 3/2019 | Park | H01L 21/02601 |
| 2020/0266348 A1* | 8/2020 | Kim | C09K 11/883 |
| 2020/0321490 A1* | 10/2020 | Yang | H10K 50/115 |
| 2020/0321546 A1* | 10/2020 | He | H10K 50/115 |
| 2020/0328380 A1* | 10/2020 | Benzie | H10K 71/00 |
| 2020/0411719 A1* | 12/2020 | Kimoto | H10K 50/165 |
| 2021/0210730 A1* | 7/2021 | Ye | H10K 50/852 |
| 2021/0408427 A1* | 12/2021 | Wang | H10K 50/15 |

* cited by examiner

DISPLAY PANEL WITH METAL OXIDE LAYER

RELATED APPLICATION

This application claims the benefit of priority of Chinese Patent Application No. 202211230099.5 filed on Oct. 8, 2022, the contents of which are incorporated by reference as if fully set forth herein in their entirety.

FIELD OF INVENTION

The present invention relates to a field of displays, especially to a display panel and a manufacturing method thereof.

BACKGROUND OF INVENTION

In recent years, ink jet printing (IJP) can lower manufacturing costs of organic light emitting diode (OLED) display panels such that the OLED display panel has more cost competitiveness. Because of limitation of ink development of the electron transport layer and electron injection layer, an evaporation process/sputtering process is usually adopted for depositing an electron transport layer, an electron injection layer, and a cathode layer. The cathode layer is required to be electrically connected to a cathode voltage line of the driver wiring layer to achieve control and light emission of a circuit, and therefore it is required that a film formation region of the electron transport layer and the electron injection layer is less than a film formation region of the cathode layer to make the cathode layer be directly bridged to the cathode voltage line. Therefore, mask plates of two aperture designs are needed for achieving two film format regions, which has complicated processes and high related costs.

Therefore, a display panel and a manufacturing method thereof is urgently required to solve the above technical issue.

SUMMARY OF INVENTION

The present invention provides a display panel and a manufacturing method thereof that can ease a technical issue of complicated processes for forming a cathode layer, an electron injection layer, and an electron transport layer with high manufacturing costs.

The present invention provides a display panel, comprising:
 a driver wiring layer comprising cathode voltage line;
 an electron transport layer located on a side of the driver wiring layer and connected to the cathode voltage line;
 an electron injection layer located on a side of the electron transport layer away from the driver wiring layer;
 a cathode layer located on a side of the electron injection layer away from the driver wiring layer and connected to the electron injection layer; and
 a resistance reduction layer located between the cathode voltage line and the electron transport layer;
 wherein patterns of the electron transport layer and the electron injection layer are the same as a pattern of the cathode layer.

Preferably, the resistance reduction layer at least comprises a first metal oxide layer contacting the electron transport layer.

Preferably, the display panel further comprises an anode layer, a material and a film layer lamination structure of the anode layer are the same as a material and a film layer lamination structure of the resistance reduction layer.

Preferably, the resistance reduction layer further comprises a second metal oxide layer contacting the cathode voltage line and a conductive function layer located between the first metal oxide layer and the second metal oxide layer.

Preferably, the driver wiring layer further comprises a circuit layer and an insulation planarization layer located between the circuit layer and the anode layer; and the insulation planarization layer comprises a plurality of first via holes, the first via holes expose the cathode voltage line, and the resistance reduction layer is connected to the cathode voltage line through the first via holes.

Preferably, the resistance reduction layer comprises a first sub-resistance reduction portion and a second sub-resistance reduction portion located on a periphery of the first sub-resistance reduction portion and connected to the first sub-resistance reduction portion, and the second sub-resistance reduction portion is located on a sidewall of the first via holes corresponding to the insulation planarization layer.

Preferably, the driver wiring layer comprises a circuit layer and an insulation planarization layer located between the circuit layer and the anode layer of the display panel; the resistance reduction layer comprises a first sub-resistance reduction portion and a third sub-resistance reduction portion located between the periphery of the first sub-resistance reduction portion and connected to the first sub-resistance reduction portion, and the third sub-resistance reduction portion is located between the cathode voltage line and the insulation planarization layer; and the insulation planarization layer comprises a plurality of first via holes, the first via holes expose the first sub-resistance reduction portion of the resistance reduction layer, and the electron transport layer is connected to the first sub-resistance reduction portion through the first via holes.

Preferably, the display panel comprises a display region and a non-display region located on a periphery of the display region, the non-display region comprises a cathode lap region, each of the first via holes is located in the cathode lap region; and wherein the cathode layer, the electron injection layer, and the electron transport layer cover the display region and the cathode lap region.

The present invention also provides a display panel manufacturing method, comprising:
 providing an underlay;
 forming a cathode voltage line on a side of the underlay;
 forming a resistance reduction layer on a side of the cathode voltage line away from the underlay;
 forming an insulation planarization layer on the resistance reduction layer;
 patterning the insulation planarization layer and forming a plurality of first via holes, wherein the first via holes expose the resistance reduction layer;
 forming an electron transport material layer, an electron injection material layer, and a cathode material layer on a side of the insulation planarization layer away from the underlay; and
 patterning the electron transport material layer, the electron injection material layer, and the cathode material layer by a mask plate and forming an electron transport layer, an electron injection layer, and a cathode layer.

The present invention also provides a display panel manufacturing method, comprising:
 providing an underlay;
 forming a cathode voltage line on a side of the underlay;
 forming an insulation planarization layer, comprising a plurality of first via holes, on a side of the cathode voltage line away from the underlay, wherein the first via holes expose the cathode voltage line;

forming an anode material layer on a side of the insulation planarization layer away from the underlay;

patterning the anode material layer by a mask plate and forming an anode layer and a resistance reduction layer corresponding to the first via holes;

forming an electron transport material layer, an electron injection material layer, and a cathode material layer on a side of the insulation planarization layer away from the underlay; and patterning the electron transport material layer, the electron injection material layer, and the cathode material layer by a mask plate and forming an electron transport layer, an electron injection layer, and a cathode layer.

The present invention advantages: The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
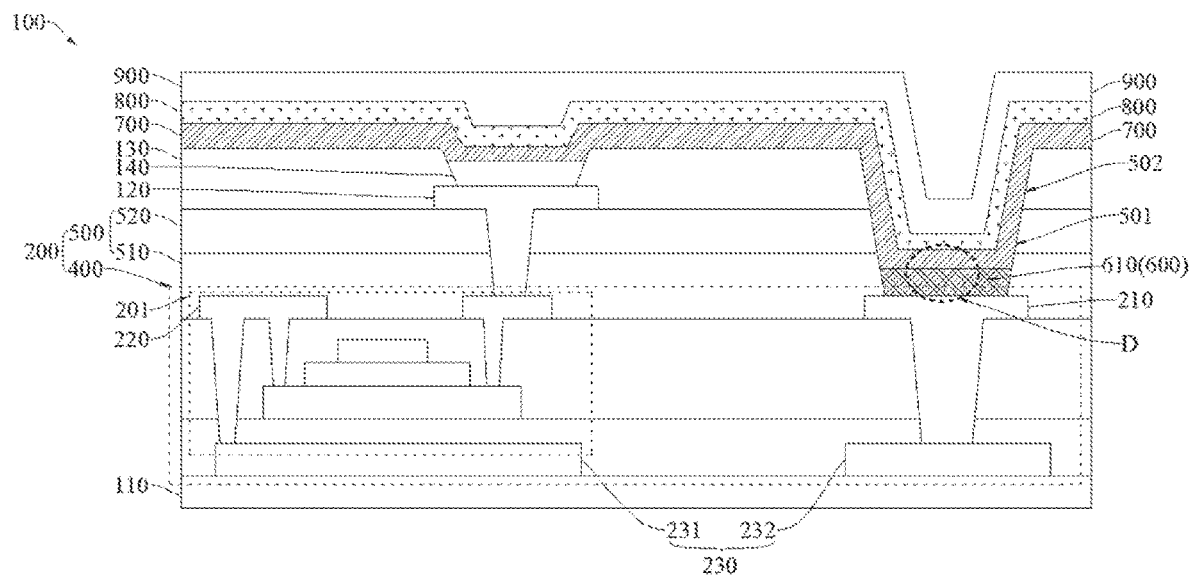
FIG. 1 is a schematic structural view of a first structure of a display panel provided by an embodiment of the present invention.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device.

In recent years, ink jet printing (IJP) can lower manufacturing costs of organic light emitting diode (OLED) display panels such that the OLED display panel has more cost competitiveness. Because of limitation of ink development of the electron transport layer and electron injection layer, an evaporation process/sputtering process is usually adopted for depositing an electron transport layer, an electron injection layer, and a cathode layer. The cathode layer is required to be electrically connected to a cathode voltage line of the driver wiring layer to achieve control and light emission of a circuit, and therefore it is required that a film formation region of the electron injection layer and the electron transport layer is less than a film formation region of the cathode layer to make the cathode layer be directly bridged to the cathode voltage line. Therefore, mask plates of two aperture designs are needed for achieving two film format regions, which has complicated processes and high related costs.

With reference to FIGS. 1 to 6, the embodiment of the present invention provides a display panel 100, comprising:

a driver wiring layer 200 comprising a cathode voltage line 210;

an electron transport layer 701 located on a side of the driver wiring layer 200 and connected to the cathode voltage line 210;

an electron injection layer 702 located on a side of the electron transport layer 701 away from the driver wiring layer 200;

a cathode layer 800 located on a side of the electron injection layer 702 away from the driver wiring layer 200 and connected to the electron injection layer 702;

a resistance reduction layer 600 located between the cathode voltage line 210 and the electron transport layer 701;

wherein patterns of the electron transport layer 701 and the electron injection layer 702 are the same as a pattern of the cathode layer 800.

The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

Technical solutions of the present invention are described in combination with specific embodiments.

By a mask plate, the cathode layer 800, the electron injection layer 702, and the electron transport layer 701 are patterned simultaneously to form the same pattern, which simplifies a mask plate patterning process and reduces a number of mask plates. For convenience of description, the electron injection layer 702 and the electron transport layer 701 can be indicated by a layer 700 in the figures. For a mass production line, in a logistics design, only one main cavity body (each main cavity body comprises a cavity body such as mask plate separating cavity, mask plate alignment cavity, evaporation cavity/sputtering cavity, mask plate turning cavity, buffer cavity, etc.) is required to be designed, an evaporation line body is short, and an apparatus investment cost is low.

However, an electron injection layer 702 and an electron transport layer 701 exist between the cathode layer 800 and the cathode voltage line 210. The electron injection layer 702 and the electron transport layer 701 usually are organic materials and have poor conductivity and large contact resistance, which influences an electrical bridge effect between the cathode layer 800 and the cathode voltage line 210 to further influence electrical properties of the display panel 100. Therefore, an objective is to dispose a resistance reduction layer 600 between the cathode voltage line 210 and the electron transport layer 701 to lower the contact resistance among the cathode layer 800, the electron injection layer 702, the electron transport layer 701, and the cathode voltage line 210, which enhances electrical conductivity of the cathode bridge and improves the display effect.

The resistance reduction layer 600 is located between the cathode voltage line 210 and the electron transport layer 701, which means that the resistance reduction layer 600 is located between a film layer on which the cathode voltage line 210 is located and a film layer on which the electron transport layer 701 is located.

The display panel 100 comprises a display region A and a non-display region B located on a periphery of the display region A. Patterns of the electron transport layer 701 and the electron injection layer 702 are the same as a pattern of the cathode layer 800. The electron transport layer 701, the electron injection layer 702, and the cathode layer 800 all cover the entire display region A and extend toward the non-display region B. By a mask plate, the cathode layer 800 and the electron injection layer 702, electron transport layer 701 are simultaneously patterned such that the electron transport layer 701, the electron injection layer 702, and the cathode layer 800 are flush with one another on an edge of the non-display region B.

Figure 2:
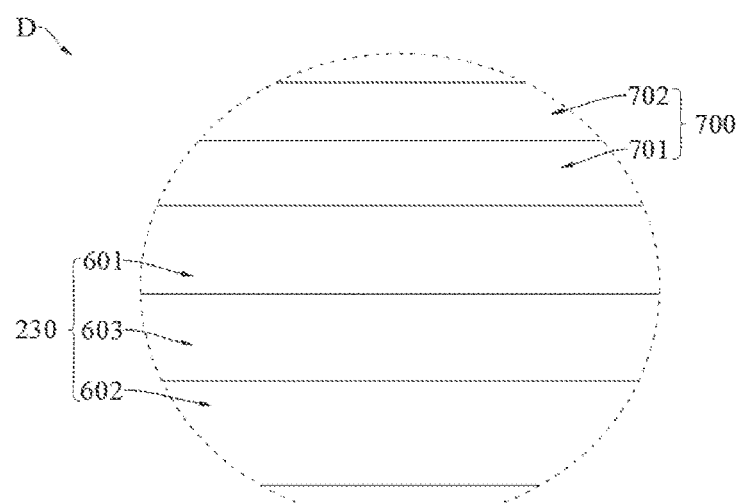
FIG. 2 is a schematic enlarged view of a region D in FIG. 1.

In some embodiments, with reference to FIGS. 1 and 2, the resistance reduction layer 600 at least comprises a first metal oxide layer 601 contacting the electron transport layer 701.

The cathode voltage line 210 usually employs a lamination metal structure such as metal Mo, or Mo\Al\Mo, Mo\Ti\Cu. Therefore, the electron transport layer 701 would directly contact metal such as Mo, MoTi. contact resistances of the electron transport layer 701 and Mo and MoTi is large. After metal materials with different work functions are used to contact the electron transport layer 701 through a film layer contact resistance test, it is discovered that metal oxide such as ITO, IZO, IGZO, ZnO, WoO has a lower a contact resistance with the electron transport layer 701. Therefore, the first metal oxide layer 601 contacting the electron transport layer 701 can lower the contact resistance among the cathode layer 800, electron injection layer 702, the electron transport layer 701, and the cathode voltage line 210, enhance electrical conductivity of the cathode bridge and improve the display effect.

In some embodiments, the display panel 100 further comprises an anode layer 120, a material and a film layer lamination structure of the anode layer 120 are the same as a material and a film layer lamination structure of the resistance reduction layer 600.

A side of the anode layer 120 near the electron transport layer 701 can use a metal oxide material layer. The anode layer 120 and the resistance reduction layer 600 can be formed simultaneously during manufacturing the anode layer 120 by the same mask plate such that the material and film layer lamination structure of the resistance reduction layer 600 are the same as the material and film layer lamination structure of the anode layer 120, which can save a mask plate, simplify the processes, and lower the manufacturing cost.

In some embodiments, with reference to FIGS. 1 and 2, the resistance reduction layer 600 further comprises a second metal oxide layer 602 contacting the cathode voltage line 210 and a conductive function layer 603 located between the first metal oxide layer 601 and the second metal oxide layer.

The material and film layer lamination structure of the resistance reduction layer 600 is the same as the material and film layer lamination structure of the anode layer 120. The anode layer 120 is also a lamination of metal oxide-conductive function-metal oxide, for example, the structure can be ITO/Ag/ITO, IZO/Ag/IZO, and the upper and lower metal oxide layers contact the cathode voltage line 210, the electron injection layer 702, and the electron transport layer 701, which can more directly lower contact resistance, enhance electrical conductivity of the cathode bridge to improve the display effect.

In some embodiments, with reference to FIG. 1, the driver wiring layer 200 further comprises a circuit layer 400 and an insulation planarization layer 500 located between the circuit layer 400 and the anode layer 120. The insulation planarization layer 500 comprises a plurality of first via holes 501. The first via holes 501 expose the cathode voltage line 210. The resistance reduction layer 600 is connected to the cathode voltage line 210 through the first via holes 501.

The resistance reduction layer 600 and the anode layer 120 are manufactured in the same process by the same mask plate. A step for manufacturing the anode layer 120 is after a step for manufacturing the insulation planarization layer 500. Also, the anode layer 120 and the resistance reduction layer 600 are manufactured after formation of the first via holes 501. Patterning the resistance reduction layer 600 can be positioned according to positions of the first via holes 501 to facilitate formation of a precision pattern to cover a bottom portion of the first via holes 501, increase electrical conductivity of the cathode bridge, and improve the display effect.

Figure 3:
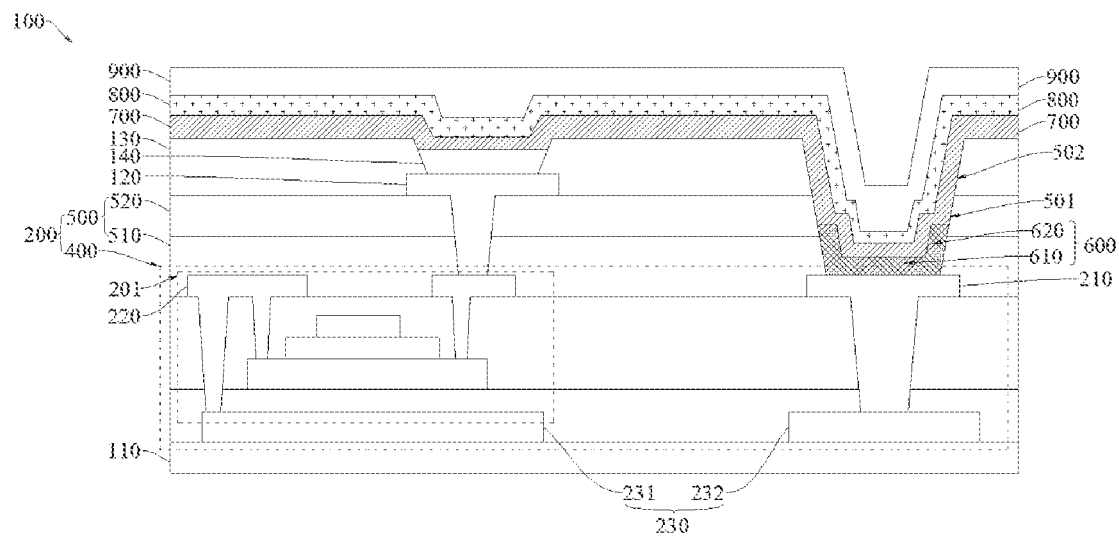
FIG. 3 is a schematic structural view of a second structure of the display panel provided by the embodiment of the present invention.

In some embodiments, with reference to FIG. 3, the resistance reduction layer 600 comprises a first sub-resistance reduction portion 610 and a second sub-resistance reduction portion 620 located on a periphery of the first sub-resistance reduction portion 610 and connected to the first sub-resistance reduction portion 610. The second sub-resistance reduction portion 620 is located on a sidewall of the first via holes 501 corresponding to the insulation planarization layer 500.

The second sub-resistance reduction portion 620 can further enhance the resistance reduction effect. Also, the second sub-resistance reduction portion 620 extends toward a sidewall of the first via holes 501 corresponding to the insulation planarization layer 500 such that a risk of the resistance reduction layer 600 separated from the right first via holes 501 while the display panel 100 is bent, which guarantees the resistance reduction effect.

Figure 4:
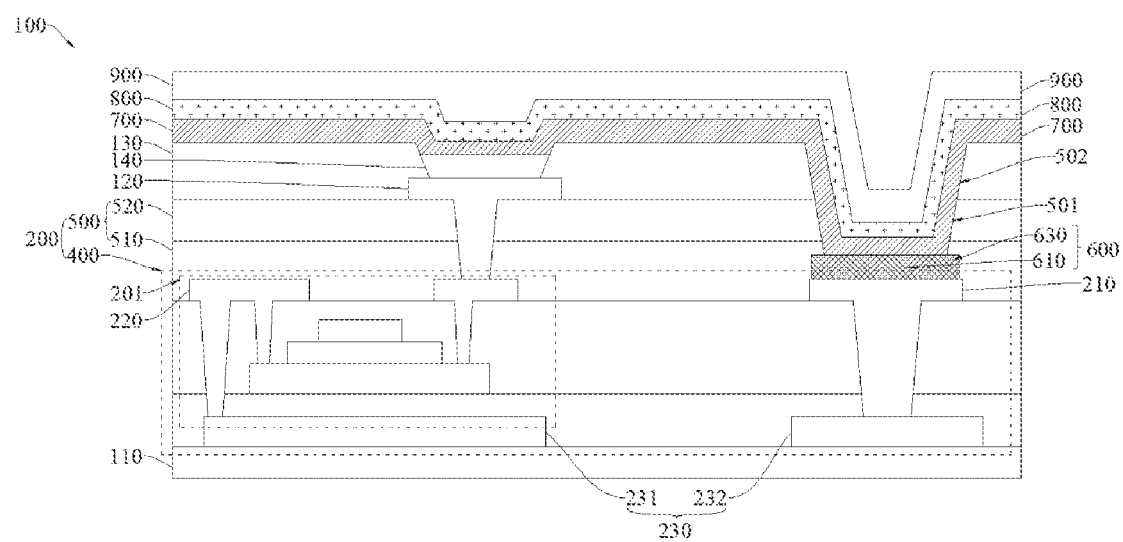
FIG. 4 is a schematic structural view of a third structure of the display panel provided by the embodiment of the present invention.

In some embodiments, with reference to FIG. 4, the driver wiring layer 200 comprises a circuit layer 400 and an insulation planarization layer 500 located between the circuit layer 400 and the anode layer 120 of the display panel 100. The resistance reduction layer 600 comprises a first sub-resistance reduction portion 610, a third sub-resistance reduction portion 630 located between a periphery of the first sub-resistance reduction portion 610 and connected to the first sub-resistance reduction portion 610, wherein the third sub-resistance reduction portion 630 is located between the cathode voltage line 210 and the insulation planarization layer 500. The insulation planarization layer 500 comprises a plurality of first via holes 501, the first via holes 501 expose the first sub-resistance reduction portion 610 of the resistance reduction layer 600. The electron transport layer 701 is connected to the first sub-resistance reduction portion 610 through the first via holes 501.

The insulation planarization layer 500 presses the third sub-resistance reduction portion 630 of the resistance reduction layer 600 such that a formation step of the resistance reduction layer 600 is before a formation step of the insulation planarization layer 500, which can improve a flatness of an entire film layer of the display panel 100. In the meantime, choices of materials of the resistance reduction layer 600 can have a wider range without limitation of the same material of the anode layer 120, which better advantages reduction of contact resistance among the cathode layer 800, the electron injection layer 702, the electron transport layer 701, and the cathode voltage line 210, enhances electrical conductivity of the cathode, and improves the display effect.

Figure 5:
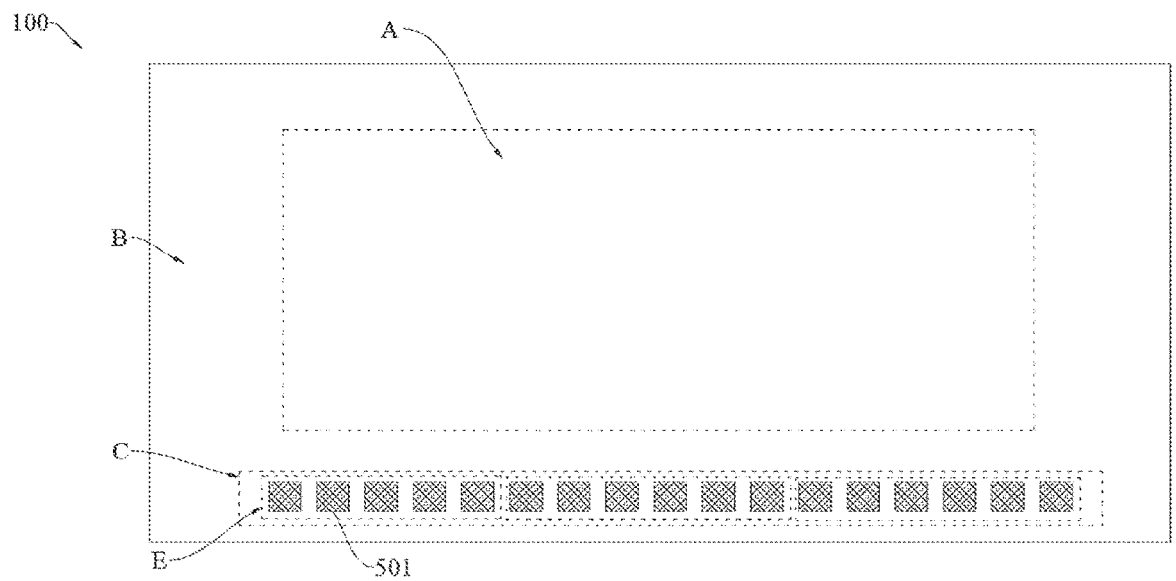
FIG. 5 is a schematic top view of a fourth structure of the display panel provided by the embodiment of the present invention.

In some embodiments, with reference to FIG. 5, the display panel 100 comprises a display region A and a non-display region B located on the periphery of the display region A. The non-display region B comprises a cathode lap region C, and each of the first via holes 501 is located in the cathode lap region C. The cathode layer 800, the electron injection layer 702, and the electron transport layer 701 cover the display region A and the cathode lap region C.

The first via holes 501 are defined in the cathode lap region C in the non-display region B. The electron injection layer 702, electron transport layer 701, and the cathode layer 800 are formed by a mask plate. The electron injection layer 702, the electron transport layer 701, and the cathode layer 800 have the same covering region, and all cover the display region A and the cathode lap region C.

In some embodiments, with reference to FIG. 1, the driver wiring layer 200 comprises a plurality of thin film transistors 201 and a light shielding layer 230 located on a side of the thin film transistors 201 away from the cathode layer 800. The light shielding layer 230 comprises a plurality of light shielding units 231 and a plurality of auxiliary wirings 232. The cathode voltage line 210 is connected to the auxiliary wirings 232 through via holes.

The cathode voltage line 210 is connected to the auxiliary wirings 232 in parallel to decrease the resistance of the cathode voltage line 210 and improve electrical properties of the display panel 100.

The thin film transistors 201 comprises the light shielding units 231, an active semiconductor, a gate electrode, a source and drain electrode 220, and corresponding insulation layers.

In some embodiments, with reference to FIG. 1, the display panel 100 further comprises an underlay 110, a pixel definition layer 130 located on a side of the insulation planarization layer 500 away from the thin film transistors 201, an encapsulation layer 900 located on a side of the cathode layer 800 away from the thin film transistors 201.

The pixel definition layer 130 comprises a plurality of pixel apertures. The pixel apertures expose the anode layer 120. The pixel apertures are filled with a light emitting function material. The light emitting function material comprises a hole function material and a light emitting material. The light emitting function material is replaced and represented by the first lamination layer 140. The pixel apertures are also filled with the electron injection layer 702 and the electron transport layer 701.

In some embodiments, with reference to FIG. 1, the pixel definition layer 130 comprises a plurality of second via holes 502, the second via holes 502 are defined to correspondingly communicate with the first via holes 501.

In some embodiments, with reference to FIG. 1, the cathode voltage line 210 and the source and drain electrode 220 are disposed in the same layer.

In some embodiments, a material of the cathode voltage line 210 is the same as a material of the source and drain electrode 220.

Figure 6:
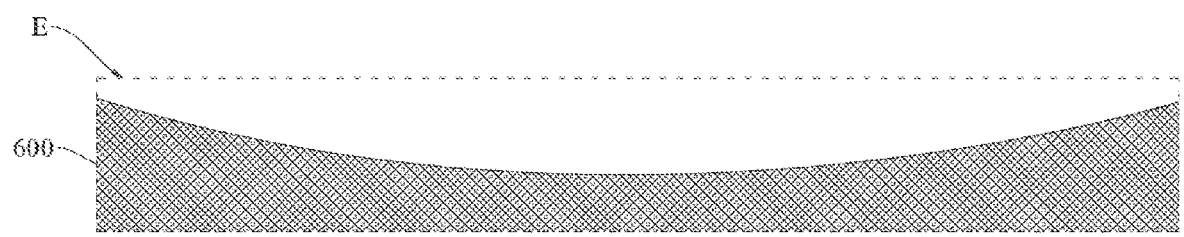
FIG. 6 is a schematic structural view of a region E in FIG. 5.

In some embodiments, with reference to FIGS. 5 and 6, the cathode lap region C comprises a plurality of sub-regions E. The first via holes 501 correspond to one sub-region E. The cathode voltage line 210 in one sub-region E is connected to a plurality of cathode fan-out wirings. In one sub-region E, a thickness of the first sub-resistance reduction portion 610 near a center of the sub-region E is less than a thickness of the first sub-resistance reduction portion 610 near an edge of the sub-regions E.

In one sub-region E, a length of the cathode fan-out wiring near the center of the sub-region E is shorter, a length of the cathode fan-out wiring near the edge of the sub-region E is longer. The cathode fan-out wirings with different lengths have different resistance and would result in a worse resistance uniformity of the cathode layer 800. Varying the thickness of the first sub-resistance reduction portion 610 improves the uniformity of a voltage in one sub-region E to increase voltage uniformity of the cathode layer 800 and improve the display effect.

In some embodiments, in one sub-region E, an area of an orthographic projection of the resistance reduction layer 600 near the center of the sub-region E on the underlay 110 is less than an area of an orthographic projection of the resistance reduction layer 600 near the edge of the sub-region E on the underlay 110.

Varying a disposing area of the resistance reduction layer 600 improves the voltage uniformity in one sub-region E to increase voltage uniformity of the cathode layer 800 and improve the display effect.

In some embodiments, a material of the active semiconductor can be metal oxide type or polysilicon type, which is not limited here.

In some embodiments, materials of the first metal oxide layer 601 and the second metal oxide layer 602 can be one of ITO, IZO, IGZO, ZnO, and WoO.

In some embodiments, with reference to FIG. 1, the insulation planarization layer 500 comprises an insulation passivation layer 510 and an organic planarization layer 520 near a side of the thin film transistors 201.

The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

Figure 7:
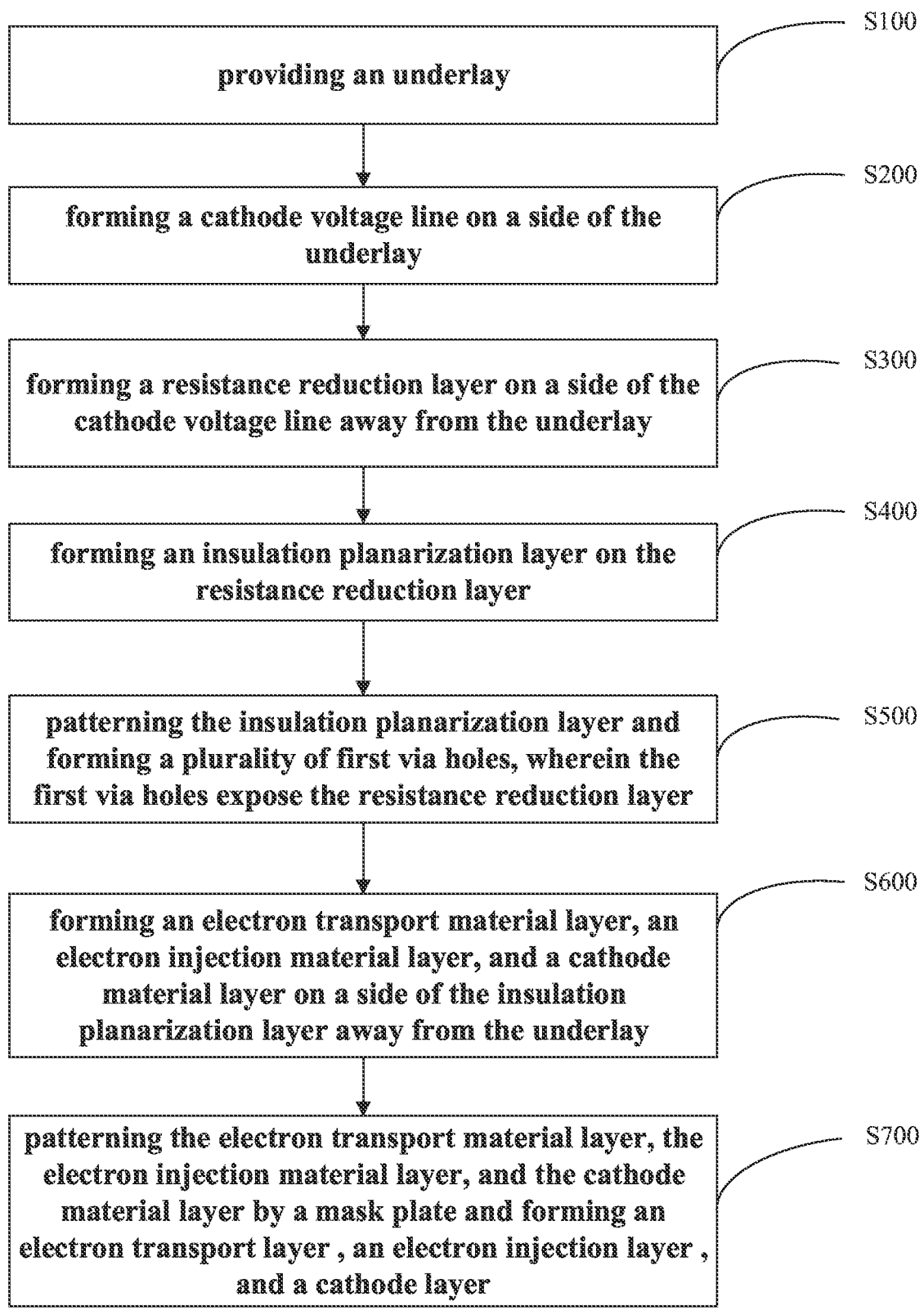
FIG. 7 is a flowchart of a manufacturing method of the display panel provided by the embodiment of the present invention.

With reference to FIG. 7, the embodiment of the present invention also provides a method for manufacturing a display panel 100, comprising steps as follows:

A step S100 comprises providing an underlay 110.

A step S200 comprises forming a cathode voltage line 210 on a side of the underlay 110.

A step S300 comprises forming a resistance reduction layer 600 on a side of the cathode voltage line 210 away from the underlay 110.

A step S400 comprises forming an insulation planarization layer 500 on the resistance reduction layer 600.

A step S500 comprises patterning the insulation planarization layer 500 and forming a plurality of first via holes 501, wherein the first via holes 501 expose the resistance reduction layer 600.

A step S600 comprises forming an electron transport material layer, an electron injection material layer, and a cathode material layer on a side of the insulation planarization layer 500 away from the underlay 110.

A step S700 comprises patterning the electron transport material layer, the electron injection material layer, and the cathode material layer by a mask plate and forming an electron transport layer 701, an electron injection layer 702, and a cathode layer 800.

The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

In some embodiments, the step S300 comprises:
a step S310a, forming a resistance reduction layer 600 including a first sub-resistance reduction portion 610 on a side of the cathode voltage line 210 away from the underlay 110.

In some embodiments, In some embodiments, the step S300 comprises:
a step S310b, forming a third sub-resistance reduction portion 630 including a first sub-resistance reduction portion 610 and a located on a periphery of the first sub-resistance reduction portion 610 and connected to the first sub-resistance reduction portion 610 on a side of the cathode voltage line 210 away from the underlay 110 to form a resistance reduction layer 600.

In some embodiments, the step S400 comprises:
a step S410, patterning the insulation planarization layer 500 and forming a plurality of first via holes 501, wherein the first via holes 501 expose the first sub-resistance reduction portion 610 of the resistance reduction layer 600.

In some embodiments, with reference to FIG. 4, the driver wiring layer 200 comprises a circuit layer 400 and an insulation planarization layer 500 located between the circuit layer 400 and the anode layer 120 of the display panel 100. The resistance reduction layer 600 further comprises a third sub-resistance reduction portion 630 located between a periphery of the first sub-resistance reduction portion 610 and connected to the first sub-resistance reduction portion 610, wherein the third sub-resistance reduction portion 630 is located between the cathode voltage line 210 and the insulation planarization layer 500. The insulation planarization layer 500 comprises a plurality of first via holes 501, the first via holes 501 expose the first sub-resistance reduction portion 610 of the resistance reduction layer 600. The electron transport layer 701 is connected to the first sub-resistance reduction portion 610 through the first via holes 501.

The insulation planarization layer 500 presses the third sub-resistance reduction portion 630 of the resistance reduction layer 600 such that a formation step of the resistance reduction layer 600 is before a formation step of the insulation planarization layer 500, which can improve a flatness of an entire film layer of the display panel 100. In the meantime, choices of materials of the resistance reduction layer 600 can have a wider range without limitation of the same material of the anode layer 120, which better advantages reduction of contact resistance among the cathode layer 800, the electron injection layer 702, the electron transport layer 701, and the cathode voltage line 210, enhances electrical conductivity of the cathode, and improves the display effect.

Figure 8:
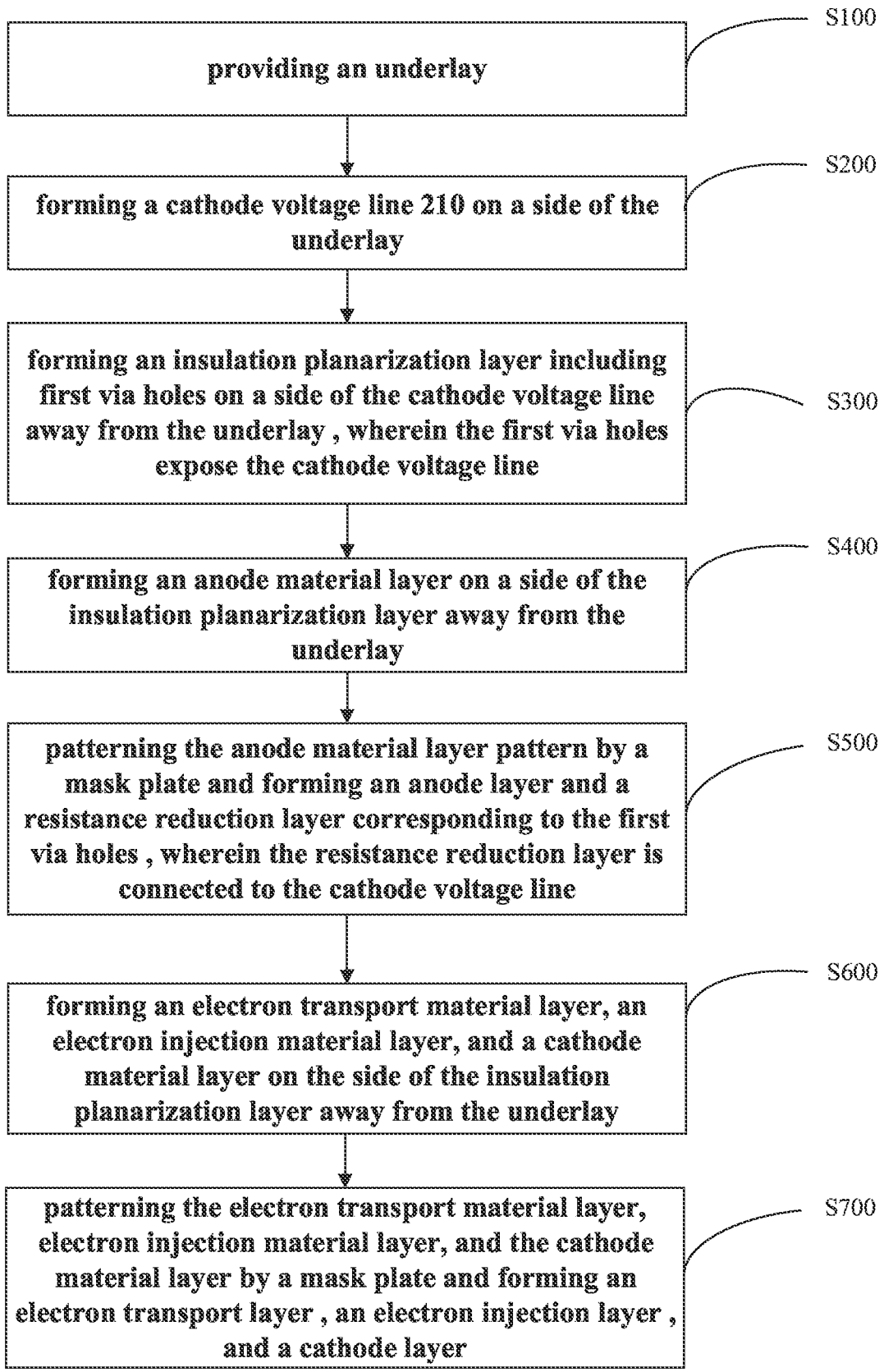
FIG. 8 is a flowchart of another manufacturing method of the display panel provided by the embodiment of the present invention.

With reference to FIG. 8, the embodiment of the present invention also provides a method for manufacturing a display panel 100, comprising steps as follows:

A step S100 comprises providing an underlay 110.

A step S200 comprises forming a cathode voltage line 210 on a side of the underlay 110.

A step S300 comprises forming an insulation planarization layer 500 including a plurality of first via holes 501 on a side of the cathode voltage line 210 away from the underlay 110, wherein the first via holes 501 expose the cathode voltage line 210.

A step S400 comprises forming an anode material layer on a side of the insulation planarization layer 500 away from the underlay 110.

A step S500 comprises patterning the anode material layer pattern by a mask plate and forming an anode layer 120 and a resistance reduction layer 600 corresponding to the first via holes 501, wherein the resistance reduction layer 600 is connected to the cathode voltage line 210.

A step S600 comprises forming an electron transport material layer, an electron injection material layer, and a cathode material layer on the side of the insulation planarization layer 500 away from the underlay 110.

A step S700 comprises patterning the electron transport material layer, electron injection material layer, and the cathode material layer by a mask plate and forming an electron transport layer 701, an electron injection layer 702, and a cathode layer 800.

The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

In some embodiments, the step S500 comprises:

a step S510a, patterning the anode material layer pattern by a mask plate and forming an anode layer 120 and a first sub-resistance reduction portion 610 corresponding to the first via holes 501 to form a resistance reduction layer 600, wherein the first sub-resistance reduction portion 610 is connected to the cathode voltage line 210.

In some embodiments, the step S500 comprises:

a step S510b, patterning the anode material layer pattern by a mask plate and forming an anode layer 120 and a first sub-resistance reduction portion 610 and a second sub-resistance reduction portion 620 corresponding to the first via holes 501 to form a resistance reduction layer 600, wherein the first sub-resistance reduction portion 610 is connected to the cathode voltage line 210.

In some embodiments, with reference to FIG. 3, the resistance reduction layer 600 comprises a first sub-resistance reduction portion 610 and a second sub-resistance reduction portion 620 located on a periphery of the first sub-resistance reduction portion 610 and connected to the first sub-resistance reduction portion 610. The second sub-resistance reduction portion 620 is located on a sidewall of the first via holes 501 corresponding to the insulation planarization layer 500.

The second sub-resistance reduction portion 620 can further enhance the resistance reduction effect. Also, the second sub-resistance reduction portion 620 extends toward a sidewall of the first via holes 501 corresponding to the insulation planarization layer 500 such that a risk of the resistance reduction layer 600 separated from the right first via holes 501 while the display panel 100 is bent, which guarantees the resistance reduction effect.

In some embodiments, with reference to FIGS. 2 and 3, the display panel 100 further comprises an anode layer 120, a material and a film layer lamination structure of the anode layer 120 are the same as a material and a film layer lamination structure of the resistance reduction layer 600.

A side of the anode layer 120 near the electron transport layer 701 can use a metal oxide material layer. The anode layer 120 and the resistance reduction layer 600 can be formed simultaneously during manufacturing the anode layer 120 by the same mask plate such that the material and film layer lamination structure of the resistance reduction layer 600 are the same as the material and film layer lamination structure of the anode layer 120, which can save a mask plate, simplify the processes, and lower the manufacturing cost.

In some embodiments, with reference to FIGS. 2 and 3, the resistance reduction layer 600 further comprises a second metal oxide layer 602 contacting the cathode voltage line 210 and a conductive function layer 603 located between the first metal oxide layer 601 and the second metal oxide layer.

The material and film layer lamination structure of the resistance reduction layer 600 is the same as the material and film layer lamination structure of the anode layer 120. The anode layer 120 is also a lamination of metal oxide-conductive function-metal oxide, for example, the structure can be ITO/Ag/ITO, IZO/Ag/IZO, and the upper and lower metal oxide layers contact the cathode voltage line 210 and the electron transport layer 701, which can more directly lower contact resistance, enhance electrical conductivity of the cathode bridge to improve the display effect.

Figure 9:
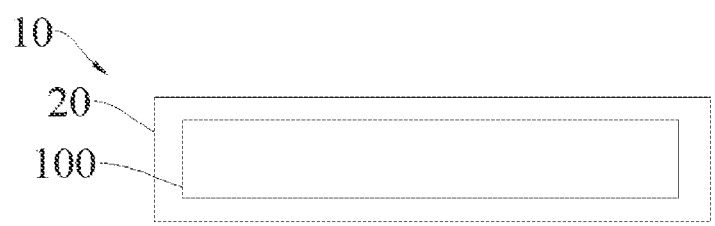
FIG. 9 is a schematic structural view of a display device provided by the embodiment of the present invention.

With reference to FIG. 9, the embodiment of the present invention also provides a display device 10 comprising any one of the above display panel 100.

Specific structures of the display panel 100 please refer to embodiments and drawings of any one of the above display panel 100, which is not repeatedly described here.

In the present embodiment, the display device 10 comprises a device main body 20, the device main body 20 is assembled to the display panel 100 integrally.

In the present embodiment, the device main body 20 can comprise a middle frame and a frame sealant. The display device 10 can be a display terminal such as cell phone, tablet, television, which is not limited here.

An embodiment of the present invention discloses a display panel and a manufacturing method thereof. The display panel includes a driver wiring layer, an electron transport layer, an electron injection layer, and a cathode layer. The driver wiring layer includes a cathode voltage line, and the electron transport layer is connected to the cathode voltage line. The cathode layer is connected to the electron injection layer. Patterns of the electron transport layer and the electron injection layer are the same as a pattern of the cathode layer. The display panel further includes a resistance reduction layer located between the cathode voltage line and the electron transport layer. The present invention simultaneously patterns the cathode layer, the electron injection layer, and the electron transport layer by a mask plate and forms the same patterns, and also disposes the resistance reduction layer among the cathode voltage line, the electron injection layer, and the electron transport layer and reduces a number of the mask plate, which simplifies production processes and lowers manufacturing costs while lowering contact resistance among the cathode layer, the electron injection layer, the electron transport layer, the cathode voltage line, enhancing conductivity of cathode bridge, and improving display effect.

The display panel and the manufacturing method thereof provided by the embodiment of the present invention are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A display panel, comprising:
   a driver wiring layer comprising cathode voltage line;
   an electron transport layer located on a side of the driver wiring layer and connected to the cathode voltage line;
   an electron injection layer located on a side of the electron transport layer away from the driver wiring layer;
   a cathode layer located on a side of the electron injection layer away from the driver wiring layer and connected to the electron injection layer; and
   a resistance reduction layer located between the cathode voltage line and the electron transport layer;
   wherein patterns of the electron transport layer and the electron injection layer are the same as a pattern of the cathode layer;
   wherein the resistance reduction layer at least comprises a first metal oxide layer contacting the electron transport layer.

2. The display panel according to claim 1, wherein the display panel further comprises an anode layer, a material and a film layer lamination structure of the anode layer are the same as a material and a film layer lamination structure of the resistance reduction layer.

3. The display panel according to claim 2, wherein the resistance reduction layer further comprises a second metal oxide layer contacting the cathode voltage line and a conductive function layer located between the first metal oxide layer and the second metal oxide layer.

4. The display panel according to claim 2, wherein the driver wiring layer further comprises a circuit layer and an insulation planarization layer located between the circuit layer and the anode layer; and the insulation planarization layer comprises a plurality of first via holes, the first via holes expose the cathode voltage line, and the resistance reduction layer is connected to the cathode voltage line through the first via holes.

5. The display pane according to claim 4, wherein the resistance reduction layer comprises a first sub-resistance reduction portion and a second sub-resistance reduction portion located on a periphery of the first sub-resistance reduction portion and connected to the first sub-resistance reduction portion, and the second sub-resistance reduction portion is located on a sidewall of the first via holes corresponding to the insulation planarization layer.

6. The display panel according to claim 1, wherein the driver wiring layer comprises a circuit layer and an insulation planarization layer located between the circuit layer and the anode layer of the display panel;

the resistance reduction layer comprises a first sub-resistance reduction portion and a third sub-resistance reduction portion located between the periphery of the first sub-resistance reduction portion and connected to the first sub-resistance reduction portion, and the third sub-resistance reduction portion is located between the cathode voltage line and the insulation planarization layer; and the insulation planarization layer comprises a plurality of first via holes, the first via holes expose the first sub-resistance reduction portion of the resistance reduction layer, and the electron transport layer is connected to the first sub-resistance reduction portion through the first via holes.

7. The display panel according to claim 4, wherein the display panel comprises a display region and a non-display region located on a periphery of the display region, the non-display region comprises a cathode lap region, each of the first via holes is located in the cathode lap region; and wherein the cathode layer, the electron injection layer, and the electron transport layer cover the display region and the cathode lap region.

8. A display panel, comprising:

a driver wiring layer comprising cathode voltage line;

an electron transport layer located on a side of the driver wiring layer and connected to the cathode voltage line;

an electron injection layer located on a side of the electron transport layer away from the driver wiring layer;

a cathode layer located on a side of the electron injection layer away from the driver wiring layer and connected to the electron injection layer; and a resistance reduction layer located between the cathode voltage line and the electron transport layer;

wherein patterns of the electron transport layer and the electron injection layer are the same as a pattern of the cathode layer;

wherein the driver wiring layer comprises a circuit layer and an insulation planarization layer located between the circuit layer and the anode layer of the display panel;

wherein the resistance reduction layer comprises a first sub-resistance reduction portion and a third sub-resistance reduction portion located between the periphery of the first sub-resistance reduction portion and connected to the first sub-resistance reduction portion, and the third sub-resistance reduction portion is located between the cathode voltage line and the insulation planarization layer; and wherein the insulation planarization layer comprises a plurality of first via holes, the first via holes expose the first sub-resistance reduction portion of the resistance reduction layer, and the electron transport layer is connected to the first sub-resistance reduction portion through the first via holes.

* * * * *